US011798935B2

(12) United States Patent
Davis et al.

(10) Patent No.: US 11,798,935 B2
(45) Date of Patent: Oct. 24, 2023

(54) APPARATUS WITH VOLTAGE PROTECTION MECHANISM

(71) Applicant: Micron Technology, Inc., Boise, ID (US)

(72) Inventors: James E. Davis, Meridian, ID (US); Milind Nemchand Furia, Boise, ID (US); Michael D. Chaine, Boise, ID (US); Eric J. Smith, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/871,681

(22) Filed: Jul. 22, 2022

(65) Prior Publication Data

US 2022/0359495 A1 Nov. 10, 2022

Related U.S. Application Data

(62) Division of application No. 16/712,851, filed on Dec. 12, 2019, now Pat. No. 11,398,468.

(51) Int. Cl.

| | |
|---|---|
| *G11C 16/30* | (2006.01) |
| *G11C 16/04* | (2006.01) |
| *G11C 5/14* | (2006.01) |
| *H01L 27/02* | (2006.01) |
| *H01L 21/8222* | (2006.01) |

(52) U.S. Cl.
CPC ............ *H01L 27/0262* (2013.01); *G11C 5/14* (2013.01); *G11C 16/30* (2013.01); *H01L 21/8222* (2013.01); *G11C 16/0483* (2013.01)

(58) Field of Classification Search
CPC ........ H01L 27/0262; G11C 5/14; G11C 16/30

USPC ....................................................... 365/185.18
See application file for complete search history.

(56) References Cited

U.S. PATENT DOCUMENTS

| | | | |
|---|---|---|---|
| 2004/0201033 A1* | 10/2004 | Russ | ................... H01L 27/0262 257/107 |
| 2007/0247772 A1 | 10/2007 | Keppens et al. | |
| 2013/0289901 A1 | 10/2013 | Samreth | |
| 2017/0069618 A1 | 3/2017 | Altolaguirre et al. | |
| 2021/0183851 A1 | 6/2021 | Davis et al. | |

FOREIGN PATENT DOCUMENTS

| | | |
|---|---|---|
| JP | 2006523032 A | 10/2006 |
| JP | 2009534845 A | 9/2009 |

OTHER PUBLICATIONS

KR Patent Application No. 10-2020-0171328—Korean Office Action and Search Report, dated Oct. 30, 2021, with English Translation, 9 pages.

* cited by examiner

*Primary Examiner* — Anthan Tran
(74) *Attorney, Agent, or Firm* — Perkins Coie LLP

(57) ABSTRACT

An apparatus includes a protection circuit electrically connected to first and second voltage domains. The protection circuit includes a first silicon-controlled rectifier (SCR) and a second SCR connected in anti-parallel configuration. The first SCR is configured to connect the first voltage domain and the second voltage domain based on detection of a first triggering condition. The second SCR is configured to connect the second voltage domain and the first voltage domain based on detection of a second triggering condition. The protection circuit is configured to isolate the first and second voltage domains without the triggering conditions.

5 Claims, 6 Drawing Sheets

US 11,798,935 B2

APPARATUS WITH VOLTAGE PROTECTION MECHANISM

CROSS-REFERENCE TO RELATED APPLICATION(S)

This application is a division of U.S. patent application Ser. No. 16/712,851, filed Dec. 12, 2019, which is incorporated herein by reference in its entirety.

TECHNICAL FIELD

The disclosed embodiments relate to apparatus, and, in particular, to electronic apparatus with a voltage protection mechanism.

BACKGROUND

Electronic devices frequently utilize multiple voltage levels during operation. For example, memory devices (e.g., flash memory and/or random-access memory (RAM)) can utilize lower voltage levels (e.g., up to 5V) to represent data states and higher voltage levels (e.g., greater than 5V, such as 20V) to program and/or erase the data states. The relatively large difference in the voltage levels can present challenges that need to be overcome to prevent potential failures, such as electro-static discharge (ESD) events associated with the application of electricity through an external contact, an electrical short, and/or a dielectric breakdown. ESD events may last for a relatively short duration (e.g., 10 milliseconds or less), but increase internal operating voltages/currents by a factor of 2 or greater, thereby damage the devices.

DETAILED DESCRIPTION

As described in greater detail below, the technology disclosed herein relates to electronic apparatus/systems and related method for providing discharge protection. The electronic apparatus (e.g., memory devices, such as NAND devices) can include an ESD protection circuit between different voltage domains. For example, the memory devices (e.g., NAND Flash devices) can have storage cells that operate or store charges at lower voltage levels (e.g., less than 5V) to represent stored information. Also, the memory devices can include other circuits that utilize higher voltages (e.g., greater than 5V, such as 10V or 20V), such as for programming and/or erasing the stored information.

In some embodiments, the ESD protection circuit can include a set of anti-parallel (e.g., identical or matching configurations that are parallel to each other but oriented in opposite directions) ESD silicon-controlled rectifiers (SCRs) between different voltage domains. For example, each of the SCRs (e.g., PNPN silicon devices) can include a connection circuit and/or a discharge circuit coupled to a trigger circuit (e.g., an RC-based circuit). For each of the SCRs, a source of the trigger circuit can be connected to a P-active area of a triggering anode, and a drain of the trigger circuit can be connected to an N-active area of the triggering anode. During normal operations, the SCRs can be in the off-state based on the P and N active areas being at relatively equal potential and the trigger circuit being in the on-state. During an ESD event, the trigger circuit can shift to an on-state. A potential difference can be allowed between the P and N active areas in the SCR turning on the PNP and in turn the NPN, thereby providing the characteristic low impedance ESD protection found with SCR.

Figure 1:
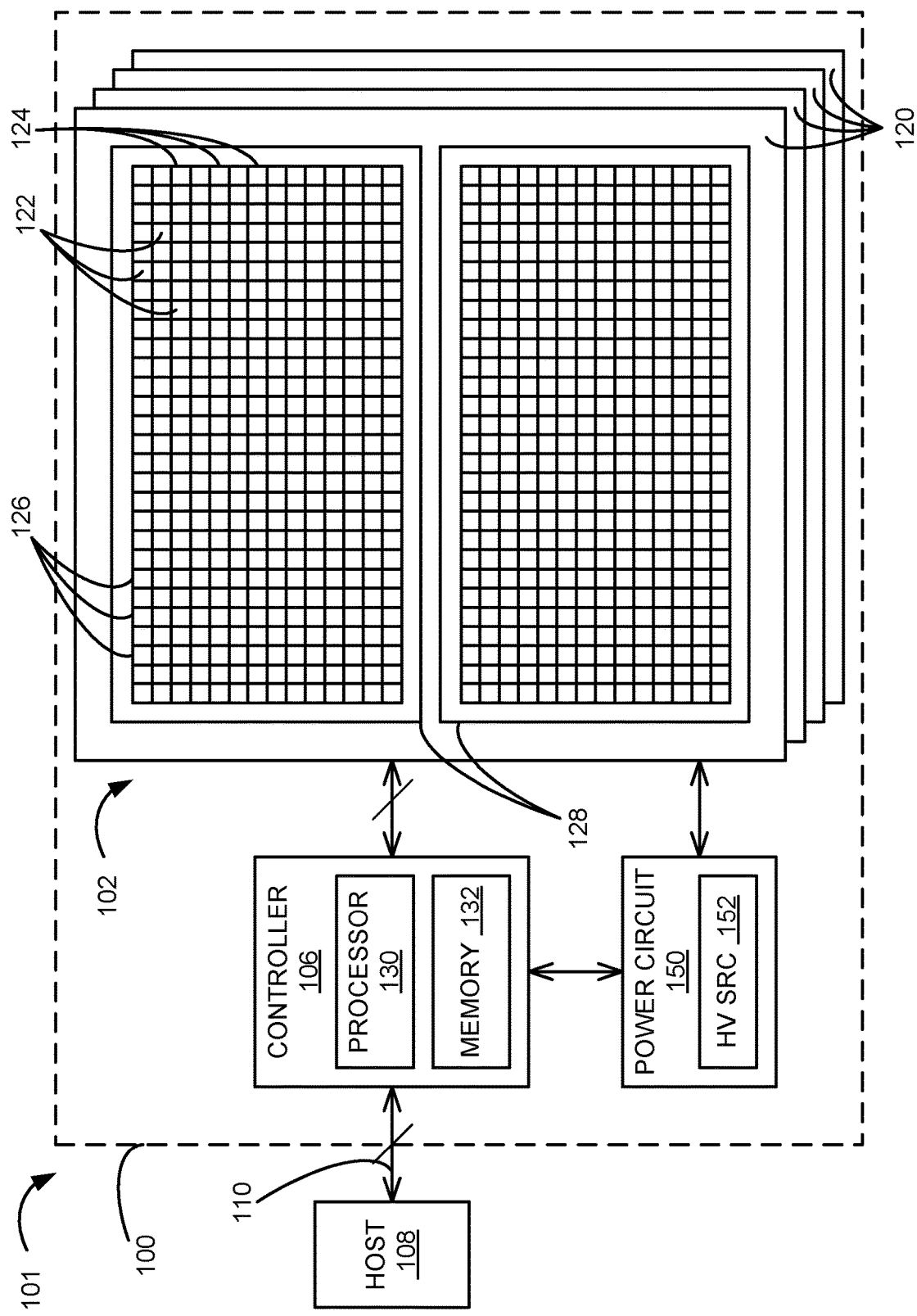
FIG. 1 is a block diagram of a memory system configured in accordance with an embodiment of the present technology.

FIG. 1 is a block diagram of a system 101 having a memory device 100 configured in accordance with an embodiment of the present technology. As shown, the memory device 100 includes a main memory 102 (e.g., NAND flash, NOR flash, chalcogenide PCM, etc.) and a controller 106 operably coupling the main memory 102 to a host device 108 (e.g., an upstream central processor (CPU)). The main memory 102 includes a plurality of memory regions, or memory units 120, which each include a plurality of memory cells 122. Memory units 120 can be individual memory dies, memory planes in a single memory die, a stack of memory dies vertically connected with through-silicon vias (TSVs), or the like. For example, in one embodiment, each of the memory units 120 can be formed from a semiconductor die and arranged with other memory unit dies in a single device package (not shown). In other embodiments, multiple memory units 120 can be co-located on a single die and/or distributed across multiple device packages. The memory cells 122 can include, for example, floating gate, charge trap, phase change, ferroelectric, magnetoresistive, and/or other suitable storage elements configured to store data persistently or semi-persistently. The main memory 102 and/or the individual memory units 120 can also include other circuit components (not shown), such as multiplexers, decoders, buffers, read/write drivers, address registers, data out/data in registers, etc., for accessing and/or programming (e.g., writing) the memory cells 122 and other functionality, such as for processing information and/or communicating with the controller 106.

Memory cells 122 can be arranged in rows 124 (e.g., each corresponding to a word line) and columns 126 (e.g., each corresponding to a bit line). Each word line can include one or more memory pages, depending upon the number of data states the memory cells 122 of that word line are configured to store. For example, a single word line of memory cells 122 in which each memory cell 122 is configured to store one of two data states (e.g., SLC memory cells configured to store one bit each) can include a single memory page. Alternatively, a single word line of memory cells 122 in which each memory cell 122 is configured to store one of four data states (e.g., MLC memory cells configured to store two bits each) can include two memory pages. Moreover, memory pages can be interleaved so that a word line comprised of memory cells 122 in which each memory cell 122 is configured to store one of two data states (e.g., SLC memory cells) can span two memory pages, in an "even-odd bit line architecture," where all the memory cells 122 in odd-numbered columns 126 of a single word line are grouped as a first memory page, and all the memory cells 122 in even-numbered columns 126 of the same word line are grouped as a second memory page. When even-odd bit line architecture is utilized in a word line of memory cells 122 in which each memory cell 122 is configured to store larger numbers of data states (e.g., memory cells configured as MLC, TLC, QLC, etc.), the number of memory pages per word line can be even higher (e.g., 4, 6, 8, etc.).

Each column 126 can include a string of series-coupled memory cells 122 connected to a common source. The memory cells 122 of each string can be connected in series between a source select transistor (e.g., a field-effect transistor) and a drain select transistor (e.g., a field-effect transistor). Source select transistors can be commonly coupled to a source select line, and drain select transistors can be commonly coupled to a drain select line.

In other embodiments, the memory cells 122 can be arranged in different types of hierarchies and/or groups than those shown in the illustrated embodiments. Further, although shown in the illustrated embodiments with a certain number of memory cells, rows, columns, blocks, and memory units for purposes of illustration, the number of memory cells, rows, columns, blocks, and memory units can vary, and can, in other embodiments, be larger or smaller in scale than shown in the illustrated examples. For example, in some embodiments, the memory device 100 can include only one memory unit 120. Alternatively, the memory device 100 can include 2, 3, 4, 8, 10, or more (e.g., 16, 32, 64, or more) memory units 120. Although the memory units 120 are shown in FIG. 1 as including two memory blocks 128 each, in other embodiments, each memory unit 120 can include 1, 3, 4, 8, or more (e.g., 16, 32, 64, 100, 128, 256, or more) memory blocks. In some embodiments, each memory block 128 can include, for example, $2^{15}$ memory pages, and each memory page within a block can include, for example, $2^{12}$ memory cells 122 (e.g., a "4k" page).

The controller 106 can be a microcontroller, special purpose logic circuitry (e.g., a field programmable gate array (FPGA), an application specific integrated circuit (ASIC), etc.), or other suitable processor. The controller 106 can include a processor 130 configured to execute instructions stored in memory. In the illustrated example, the memory of the controller 106 includes an embedded memory 132 configured to perform various processes, logic flows, and routines for controlling operation of the memory device 100, including managing the main memory 102 and handling communications between the memory device 100 and the host device 108. In some embodiments, the embedded memory 132 can include memory registers storing, for example, memory pointers, fetched data, etc. The embedded memory 132 can include volatile and/or non-volatile memory (e.g., DRAM, SRAM, NAND, NOR, PCM) for storing the memory registers, and can also include read-only memory (ROM) (e.g., for storing micro-code). Although in the example set forth in FIG. 1, a memory device 100 has been illustrated as including a controller 106, in another embodiment of the present technology, a memory device may not include a controller, and may instead rely upon external control (e.g., provided by an external host, or by a processor or controller separate from the memory device).

In operation, the controller 106 can directly write or otherwise program (e.g., erase) the various memory regions of the main memory 102, such as by writing to groups of memory pages and/or memory blocks 128. In NAND-based memory, a write operation often includes programming the memory cells 122 in selected memory pages with specific data values (e.g., a string of data bits having a value of either logic 0 or logic 1). An erase operation is similar to a write operation, except that the erase operation re-programs an entire memory block 128 or multiple memory blocks 128 to the same data state (e.g., logic 1).

The controller 106 and/or the main memory 102 can be coupled to a power circuit 150 configured to provide power used during operation. The power circuit 150 can provide lower voltages (e.g., below 5V) and/or higher voltages (e.g., greater than 5V) to different circuits/domains. For example, the power circuit 150 can include circuit to provide the lower voltages for reading the memory regions and/or for executing internal operations. Also, the power circuit 150 can include a high voltage source 152 configured to provide the higher voltages for programming the memory regions.

The controller 106 communicates with the host device 108 over a host-device interface 110. In some embodiments, the host device 108 and the controller 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the controller 106. A request can include a command to write, erase, return information, and/or to perform a particular operation (e.g., a TRIM operation). A request can also include an interrupt or another command that indicates a change in condition (e.g., a power loss event), which can trigger the implementation of a power loss algorithm.

Host device 108 can be any one of a number of electronic devices capable of utilizing memory for the temporary or persistent storage of information, or a component thereof. For example, host device 108 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). Host device 108 may be a networking device (e.g., a switch, a router, etc.) or a recorder of digital images, audio and/or video, a vehicle, an appliance, a toy, or any one of a number of other products. In one embodiment, host device 108 may be connected directly to memory device 100, although in other embodiments, host device 108 may be indirectly connected to memory device 100 (e.g., over a networked connection or through intermediary devices).

Figure 2:
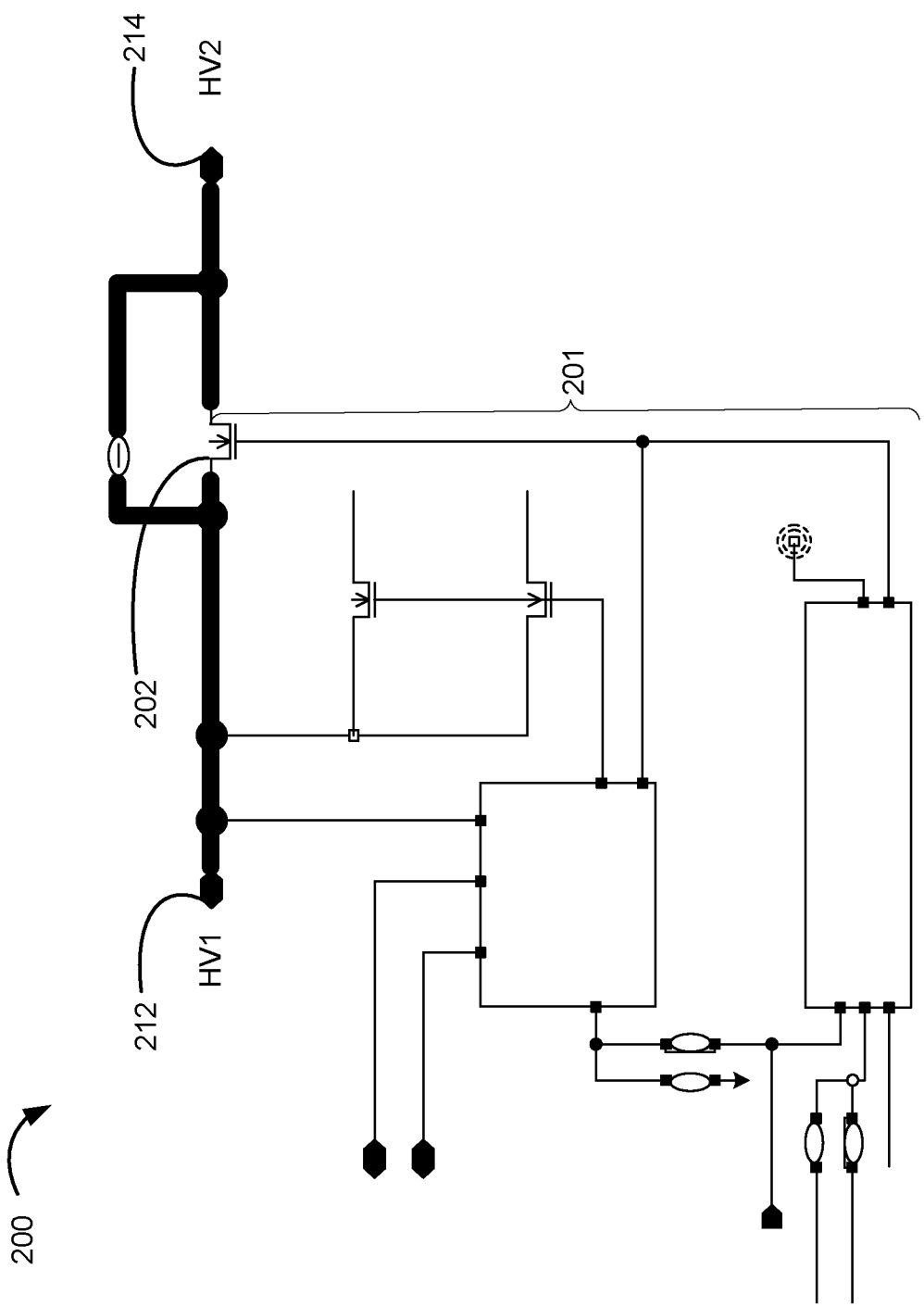
FIG. 2 is a circuit diagram of an example protection circuit in accordance with an embodiment of the present technology.

FIG. 2 is a circuit diagram of an example protection circuit 200 (e.g., an ESD protection circuit). In some NAND devices, the protection circuit 200 includes logic 201 placed between two domains. For example, a transistor 202 can connect a first voltage domain 212 (e.g., HV1, such as PMON) and a second voltage domain 214 (e.g., HV2, such as VPP). The logic 201 can be configured to detect an ESD event (e.g., an increase in monitored voltage over a threshold level and/or within a threshold duration) and turn the transistor 202 accordingly.

Figure 3:
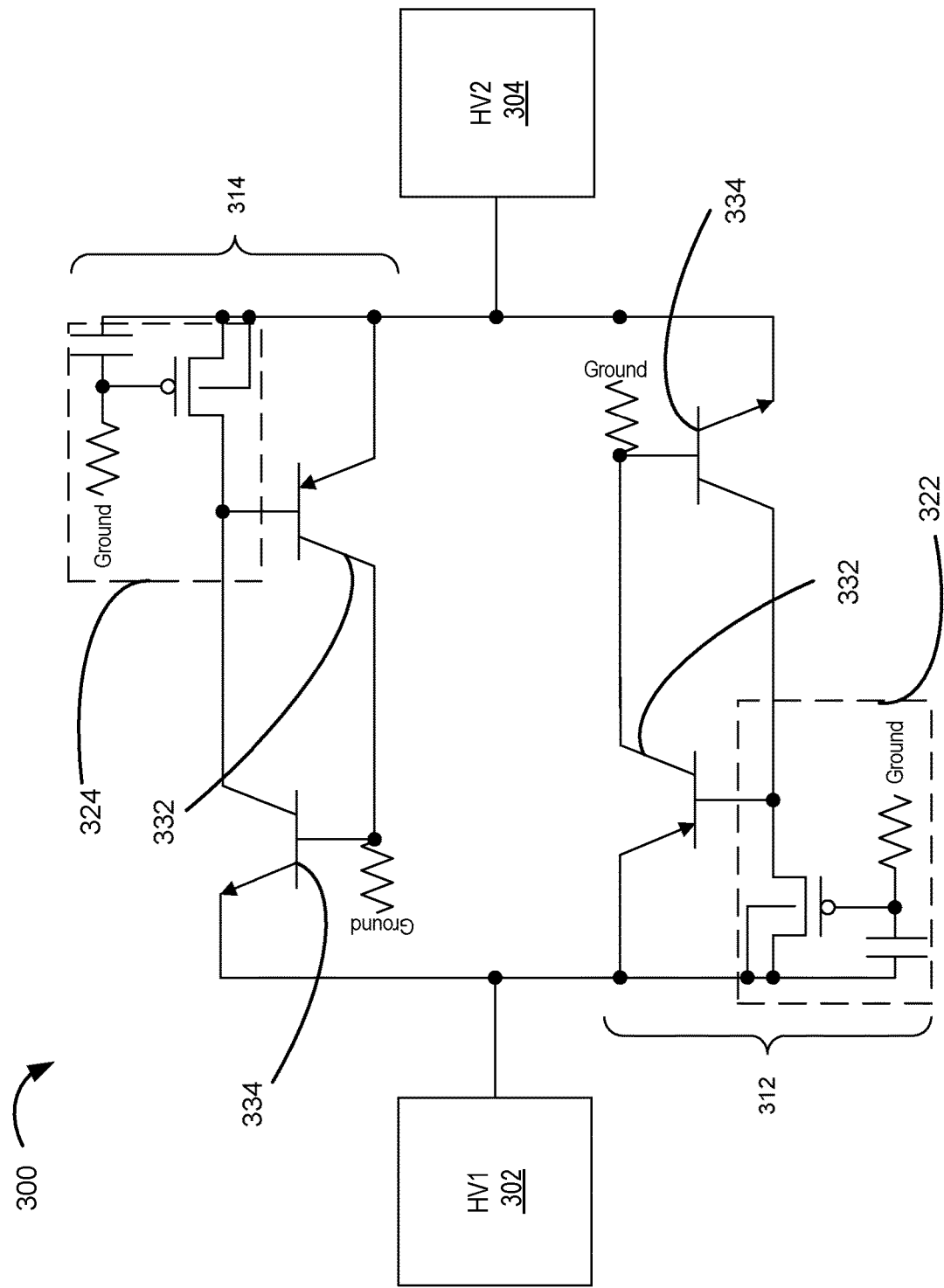
FIG. 3 is a circuit diagram of a further example protection circuit in accordance with an embodiment of the present technology.

FIG. 3 is a circuit diagram of a further example protection circuit 300 (e.g., an ESD protection circuit) in accordance with an embodiment of the present technology. In some embodiments, the memory device 100 of FIG. 1 can include the protection circuit 300 between different voltage domains. For example, the memory device can include the protection circuit 300 between a first voltage domain 302 (e.g., a high voltage (HV) domain, such as a VPP pad) and a second voltage domain 304 (e.g., a different HV domain, such as a PMON pad). The first voltage domain 302 and the second voltage domain 304 can correspond to same voltage levels or different voltage levels. In some embodiments, the first voltage domain 302 and/or the second voltage domain 304 can correspond to voltage levels greater than 5V, e.g., 10V, 21V, 28V, etc.

The protection circuit 300 can include a set of ESD protection circuits (e.g., a first SCR 312 and a second SCR 314) configured to protect the connected voltage domains and/or connections between the domains. For example, the protection circuit 300 can include the first SCR 312 and the second SCR 314 connected back-to-back and/or in anti-parallel configuration between the first voltage domain 302 and the second voltage domain 304. The first SCR 312 can be configured to disconnect the first voltage domain 302 from the second voltage domain 304 in one mode (e.g., normal operation). In another operating mode (e.g., in response to or during an ESD event), the first SCR 312 can connect the first voltage domain 302 to the second voltage domain 304. Similarly, the second SCR 314 can be configured to disconnect the voltage domains in one operating mode (e.g., during normal operation). In another operating mode, the second SCR 314 can connect the voltage domains. In other words, the protection circuit 300 can remain open during normal operation, thereby isolating the first voltage domain 302 from the second voltage domain 304.

The protection circuit 300 can further include a trigger circuit coupled to each of the ESD protection circuits and configured to control the operating modes of the ESD protection circuits. For example, the first SCR 312 and the second SCR 314 can each include a trigger circuit (e.g., a first trigger circuit 322 and a second trigger circuit 324, respectively). In some embodiments, each trigger circuit can include a transistor (e.g., a MOSFET device, such as a super-high voltage protection (SHVP) device) and a tuning circuit (e.g., an RC circuit) configured to detect ESD events. The trigger transistor can include a first terminal (e.g., a source) connected to a corresponding voltage domain and a second terminal (e.g., a drain) connected to the corresponding SCR. A control terminal (e.g., a gate) of the trigger transistor can be connected to the tuning circuit. As illustrated in FIG. 3, the tuning circuit can include a resistor (e.g., Poly) that is connected to ground on one end and connected to a capacitor (e.g., metal fringe) and the gate of the trigger transistor on the other end. The opposite terminal of the capacitor can be connected to the corresponding voltage domain. The RC values can be predetermined to define the triggering ESD conditions, such as a voltage threshold, a duration threshold, a slew rate for the change in voltage, etc. The protection circuit 300 can remain off (e.g., open circuit) during normal operations with a default-on-gate configuration using the SHVP device.

As illustrated in FIG. 3, the SCRs can each include a set of transistors (e.g., BJT devices, such as a PNP transistor and an NPN transistor) connected in an antiparallel configuration. For example, the first and second SCRs 312 and 314 can each include a grounding transistor 332 and a connecting transistor 334. For the first SCR 312, the grounding transistor 332 (e.g., the PNP transistor) can include a first terminal (e.g., an emitter) connected to the first voltage domain 302 and a second terminal (e.g., a collector) connected to a grounding path/resistor. A control terminal (e.g., a base) of the grounding transistor 332 can be connected to the trigger circuit (at, e.g., the drain of the trigger transistor) and the connecting transistor 334 (at, e.g., a collector). The connecting transistor 334 (e.g., the NPN transistor) can include a first terminal (e.g., an emitter) connected to the second voltage domain 304 and a second terminal (e.g., a collector) connected to the control terminal of the grounding transistor 332 and the trigger circuit (at, e.g., the drain of the trigger transistor). A control terminal (e.g., a base) of the connecting transistor 334 can be connected to the grounding transistor 332 (at, e.g., the collector) and the grounding path/resistor. Accordingly, during normal operation, the connecting transistor 334 and the triggering transistor can remain inactive and electrically isolate the voltage domains. When the trigger circuit detects an ESD event, the grounding transistor 332 and the connecting transistor 334 can activate, thereby providing an electrical connection between the voltage domains.

The protection circuit 300 (e.g., the first SCR 312 and the second SCR 314 connected anti-parallel to each other) between the first voltage domain 302 and the second voltage domain 304 provides increased protection against voltage fluctuations and increase robustness for the overall apparatus. For example, the first SCR 312 and the second SCR 314 connected anti-parallel to each other between the first voltage domain 302 and the second voltage domain 304 provides increased robustness in comparison to the transistor 202 of FIG. 2. Further, the first SCR 312 and the second SCR 314, each including the connecting transistor and the grounding transistor, can provide additional protection via the additional and separate connection paths.

Also, the first SCR 312 and the second SCR 314 connected anti-parallel to each other between the first voltage domain 302 and the second voltage domain 304 can provide increased flexibility for the overall apparatus by allowing the two voltage domains to be powered up independently. The protection circuit 300 can activate when the trigger circuits detect an ESD condition and remain inactive otherwise. The anti-parallel configuration of the first and second SCRs 312 and 314 can prevent leakage currents across the two voltage domains for voltage fluctuations that fail to meet the ESD condition (i.e., very high voltage/current levels for very short duration). As such, even if the voltage domains are powered at different times, the protection circuit 300 can prevent leakage currents between the two domains and from the two domains to the ground connections within the protection circuit 300. Thus, the two voltage domains may be powered on independently (i.e., in any order), thereby removing any power-up sequence requirements.

Figure 4:
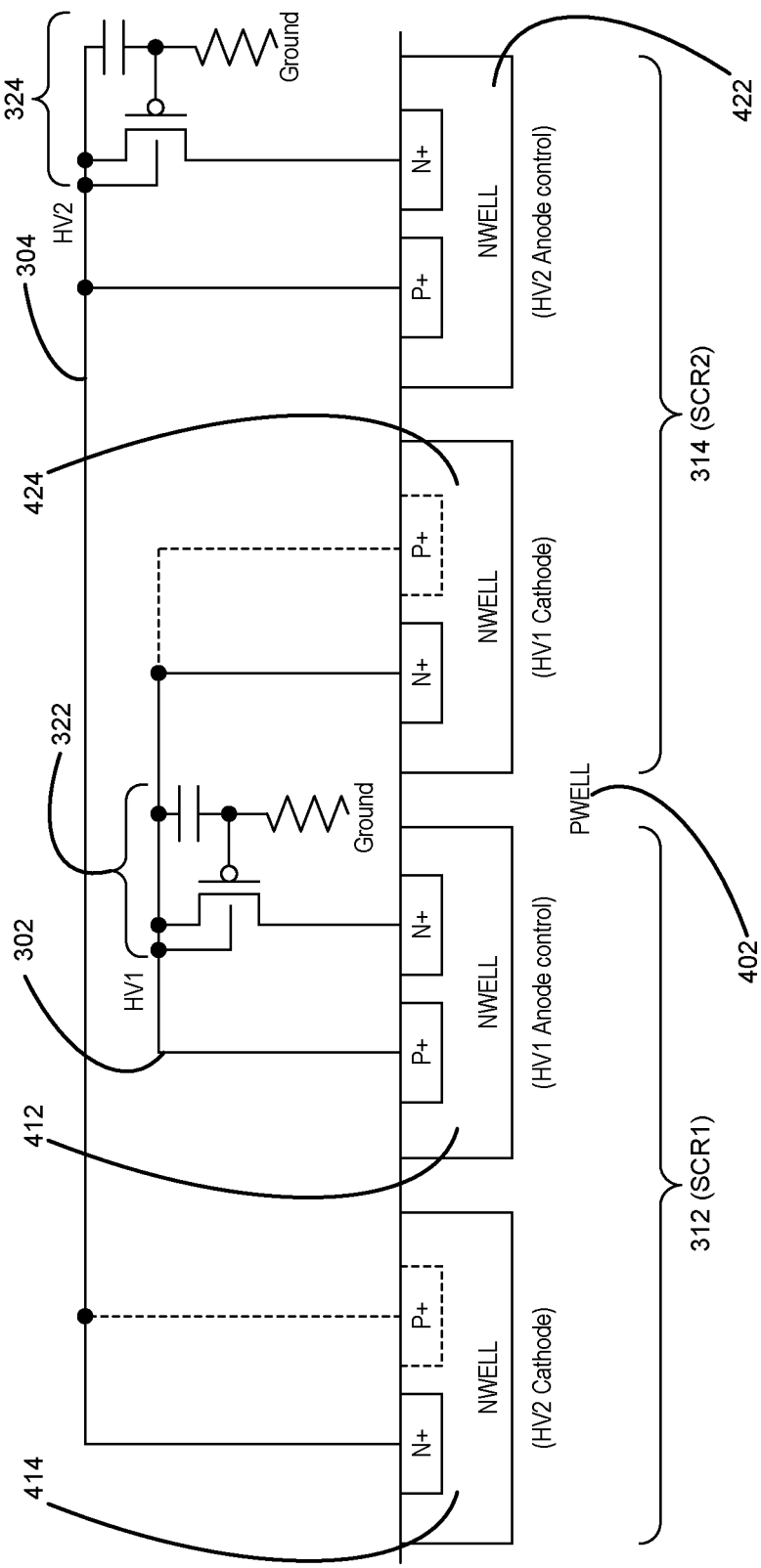
FIG. 4 is a cross-section view of the example protection circuit of FIG. 3 in accordance with an embodiment of the present technology.

FIG. 4 is a cross-section view of the example protection circuit 300 of FIG. 3 in accordance with an embodiment of the present technology. The cross-section view can illustrate the silicon-level layout of the SCRs (e.g., PNPN silicon devices). For example, the first SCR 312 and the second SCR 314 can be formed over a common P-well 402. Cathode and anode control portions of each SCR can be formed via an N-well that includes N+ and/or P+ regions therein.

The first SCR 312 can include an anode formed using an N-well 412 embedded in the common P-well 402. The anode can further include a P+ region connected to the first voltage domain 302 and an N+ region connected to the first trigger circuit 322. The first SCR 312 can further include a cathode formed using an N-well 414 embedded in the common P-well. The cathode can include an N+ region connected to the second voltage domain 304. The N-wells 412 and 414 embedded in the common P-well and having the P+ and/or the N+ regions can correspond to the grounding transistor 332 of FIG. 3 and the connecting transistor 334 of FIG. 3 of the first SCR 312.

The second SCR 314 can include an anode formed using an N-well 422 embedded in the common P-well 402. The anode can further include an N+ region connected to the second trigger circuit 324 and a P+ region connected to the second voltage domain 304. The second SCR 314 can further include a cathode formed using an N-well 424 embedded in the common P-well 402. The cathode can include an N+ region connected to the first voltage domain 302. The N-wells 422 and 424 embedded in the common P-well and having the P+ and/or the N+ regions can correspond to the grounding transistor 332 and the connecting transistor 334 of the second SCR 314.

In some embodiments, the cathode(s) of the first SCR 312 and/or the second SCR 314 can further include a P+ region connected to the second voltage domain 304 and/or the first voltage domain 302, respectively. The additional P+ region in the cathode N-wells and/or the corresponding connections can improve current design rule checking (DRC) and layout versus schematic checking (LVS) validations processes.

During normal operations, the protection circuit 300 can be off since the P and N active areas are at relatively similar potential due to the active state of the SHVP device. During an ESD event, the RC circuit can pull the voltage up on the SHVP gate, and the SHVP can be turned off. A potential difference can be allowed between the P and N active areas in the SCR, thereby turning on the PNP and in turn the NPN to provide a low impedance ESD protection with the SCR.

Figure 5:
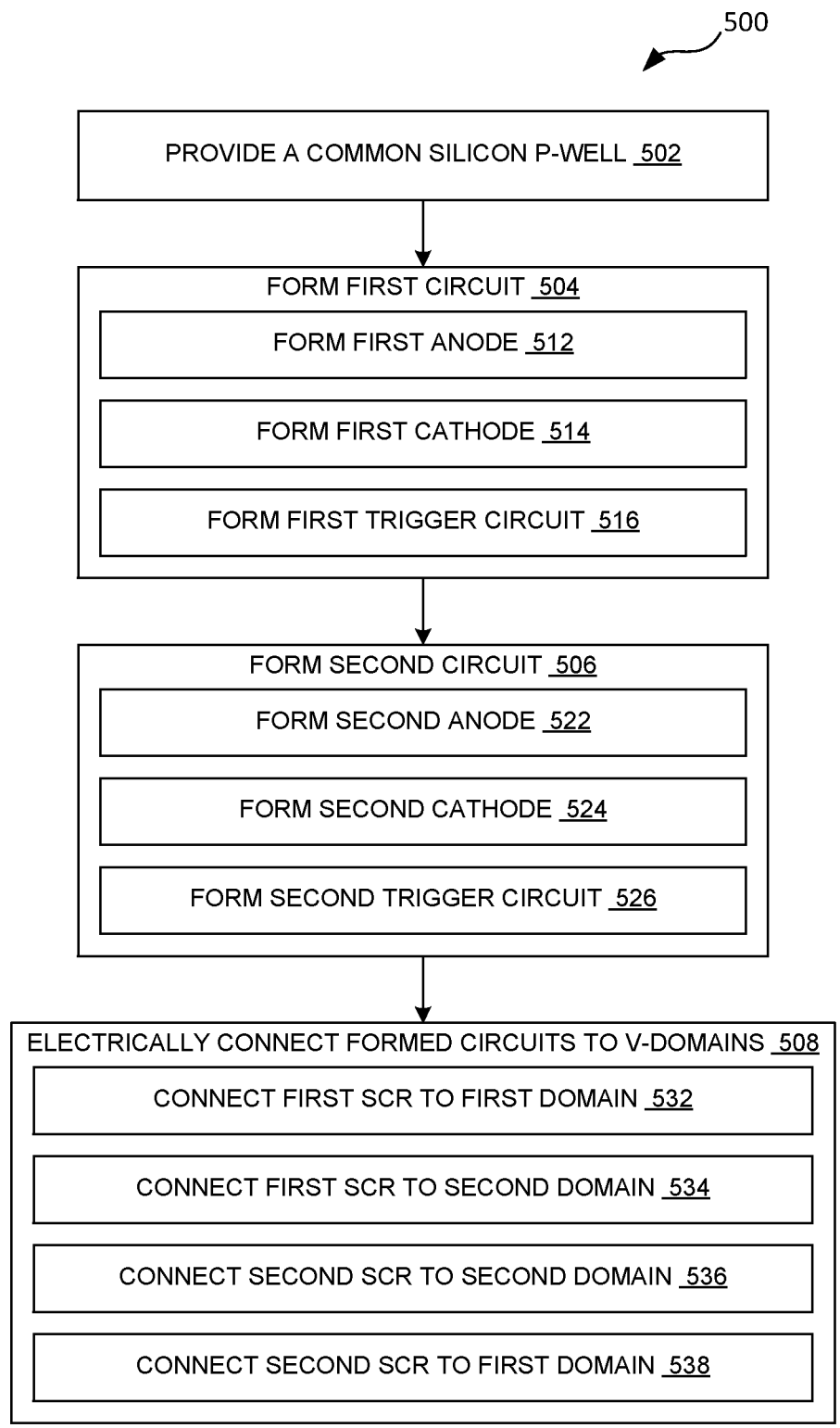
FIG. 5 is a flow diagram illustrating an example method of manufacturing an apparatus in accordance with an embodiment of the present technology.

FIG. 5 is a flow diagram illustrating an example method 500 of manufacturing an apparatus (e.g., the memory device 100 of FIG. 1, the system 101 of FIG. 1, the protection circuit 300 of FIG. 3, and/or a portion therein) in accordance with an embodiment of the present technology. For example, the method 500 can be for manufacturing the protection circuit 300 including the first SCR 312 and the second SCR 314 connected anti-parallel to each other between the first voltage domain 302 and the second voltage domain 304 as illustrated in FIG. 3 and FIG. 4.

At block 502, the method 500 can include providing a common silicon P-well (e.g., the common P-well 402 of FIG. 4). Providing the common silicon P-well can include providing a silicon P-substrate or forming a P-well in a silicon N-substrate, such as via an ion implantation process.

At block 504, the method 500 can include forming a first circuit (e.g. the first SCR 312). The first SCR 312 can be formed at least partially embedded in the common P-well 402. Forming the first SCR 312 can include forming the grounding transistor 332 of FIG. 3 and the connecting transistor 334 of FIG. 3. For example, the method 500 can include forming a first anode of the first SCR 312 at block 512 and forming a first cathode of the first SCR 312 at block 514. In some embodiments, the first anode and cathode can be formed as N-wells (e.g., the N-wells 412 of FIGS. 4 and 414 of FIG. 4, respectively) embedded in the common P-well 402. The N-wells can be formed by implanting ions to corresponding locations/regions of the common P-well 402. The N-wells can each include a P+ region and/or an N+ region formed via diffusing or ion implanting P+ and/or N+ dopants, respectively, in corresponding location/regions of the N-wells.

At block 516, the method 500 may include forming a first trigger circuit (e.g., the first trigger circuit 322 of FIG. 3). In some embodiments, the first trigger circuit can include a capacitor with a first terminal connected to the first voltage domain 302 and a second terminal connected to a resistor. The resistor can be connected to ground opposite the capacitor. The resistor and the capacitor can be tuned corresponding to a first triggering condition, such as according to a threshold voltage, a threshold duration, and/or a threshold rate of change in the voltage representative of ESD events or other potentially damaging conditions.

Forming the first trigger circuit can include forming the first trigger transistor in silicon and/or attaching the resistor and capacitor thereto. In some embodiments, the first trigger transistor can include a first terminal connected to the first voltage domain 302, a second terminal connected to the N+ region of the anode N-well, and a control terminal electrically connected to a node connecting the resistor and the capacitor. Accordingly, the first trigger circuit can be configured to change operating states, such as by switching to an off state and disconnecting the first and second voltage domains from each other, based on detection of the first triggering condition. Further, the first trigger circuit can be configured/connected to operate the grounding transistor to connect the first voltage domain 302 to a grounding path (e.g., a resistor connected to ground) based on detection of the first triggering condition.

At block 506, the method 500 can include forming a second circuit (e.g., the second SCR 314). The second SCR 314 can be formed at least partially embedded in the common P-well 402. Forming the second SCR 314 can include forming the grounding transistor 332 and the connecting transistor 334. For example, the method 500 can include forming a first anode of the second SCR 314 at block 522 and forming a first cathode of the second SCR 314 at block 524. In some embodiments, the first anode and cathode can be formed as N-wells (e.g., the N-wells 422 of FIGS. 4 and 424 of FIG. 4, respectively) embedded in the common P-well 402. The N-wells can be formed by implanting ions to corresponding locations/regions of the common P-well 402. The N-wells can each include a P+ region and/or an N+ region formed via diffusing or ion implanting P+ and/or N+ dopants, respectively, in corresponding location/regions of the N-wells.

At block 526, the method 500 may include forming a second trigger circuit (e.g., the second trigger circuit 324 of FIG. 3). In some embodiments, the second trigger circuit can include a capacitor with a first terminal connected to the second voltage domain 304 and a second terminal connected to a resistor. The resistor can be connected to ground opposite the capacitor. The resistor and the capacitor can be tuned corresponding to a second triggering condition, such as according to a threshold voltage, a threshold duration, and/or a threshold rate of change in the voltage representative of ESD events or other potentially damaging conditions. The second triggering condition can correspond to the second voltage domain 304. The second triggering condition can match or be different from the first triggering condition.

Forming the second trigger circuit can include forming the second trigger transistor in silicon and/or attaching the resistor and capacitor thereto. In some embodiments, the second trigger transistor can include a first terminal connected to the second voltage domain 304, a second terminal connected to the N+ region of the anode N-well, and a control terminal electrically connected to a node connecting the resistor and the capacitor. Accordingly, the second trigger circuit can be configured to change operating states, such as by switching to an off state and disconnecting the first and second voltage domains from each other, based on detection of the first triggering condition. Further, the second trigger circuit can be configured/connected to operate the grounding transistor to connect the second voltage domain 304 to a grounding path (e.g., a resistor connected to ground) based on detection of the second triggering condition.

At block 508, the method 500 can include electrically connecting the formed circuits (e.g., the first SCR 312 and the second SCR 314) to voltage domains (e.g., the first voltage domain 302 and the second voltage domain 304). For example, the method 500 can include connecting the first SCR 312 to the first voltage domain 302 at block 532 and connecting the first SCR 312 to the second voltage domain 304 at block 534. Connecting the first SCR 312 to the first voltage domain 302 can include connecting the P+ region of the N-well 412, the triggering transistor of the first trigger circuit 322, and/or the capacitor of the first trigger circuit 322 to the first voltage domain 302. Connecting the first SCR 312 to the second voltage domain 304 can include connecting the N+ region and/or the P+ region of the N-well 414 to the second voltage domain 304.

Also, the method 500 can include connecting the second SCR 314 to the second voltage domain 304 at block 536 and connecting the second SCR 314 to the first HV domain at block 538. Connecting the second SCR 314 to the second voltage domain 304 can include connecting the P+ region of the N-well 422, the triggering transistor of the second trigger circuit 324, and/or the capacitor of the second trigger circuit 324 to the second voltage domain 304. Connecting the second SCR 314 to the first voltage domain 302 can include connecting the N+ region and/or the P+ region of the N-well 424 to the first voltage domain 302.

Figure 6:
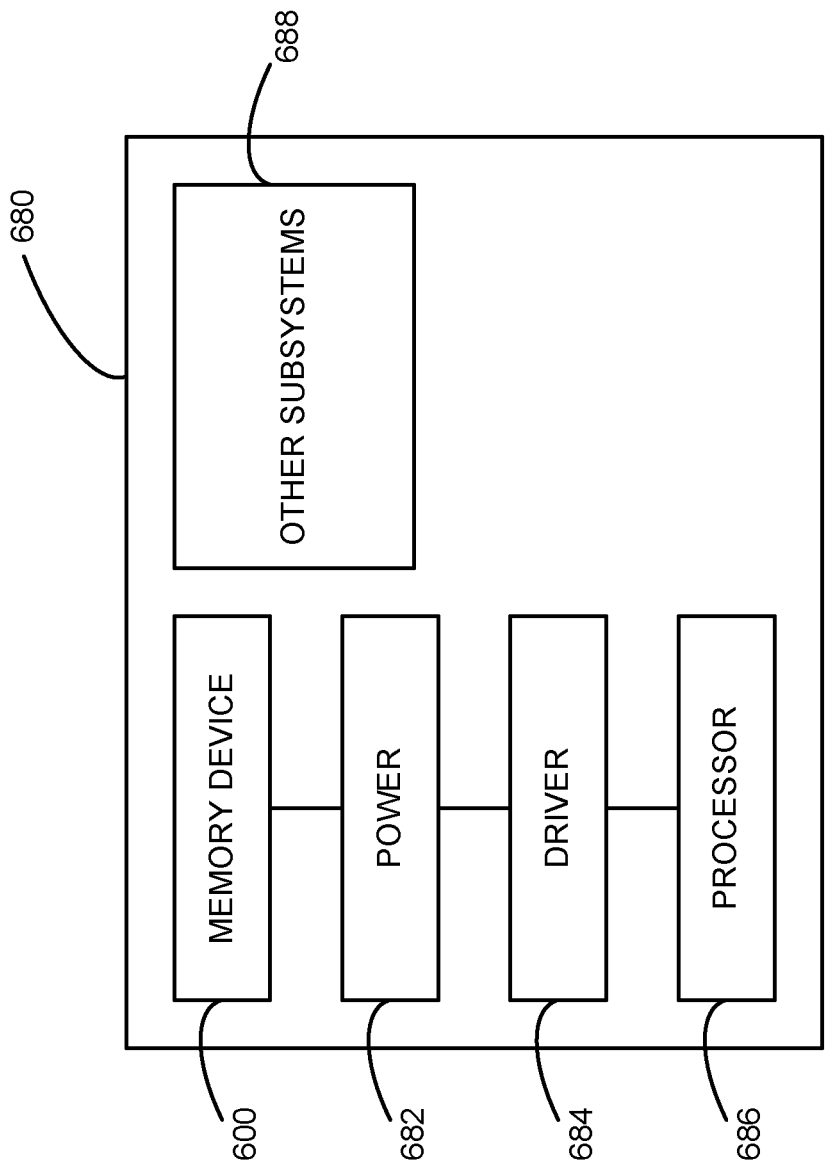
FIG. 6 is a schematic view of a system that includes a memory device in accordance with an embodiment of the present technology.

FIG. 6 is a schematic view of a system that includes a memory device in accordance with embodiments of the present technology. Any one of the foregoing memory devices described above with reference to FIGS. 1-5 can be incorporated into any of a myriad of larger and/or more complex systems, a representative example of which is system 680 shown schematically in FIG. 6. The system 680 can include a memory device 600, a power source 682, a driver 684, a processor 686, and/or other subsystems or components 688. The memory device 600 can include features generally similar to those of the memory device described above with reference to FIGS. 1-5, and can therefore include various features for performing a direct read request from a host device. The resulting system 680 can perform any of a wide variety of functions, such as memory storage, data processing, and/or other suitable functions. Accordingly, representative systems 680 can include, without limitation, hand-held devices (e.g., mobile phones, tablets, digital readers, and digital audio players), computers, vehicles, appliances and other products. Components of the system 680 may be housed in a single unit or distributed over multiple, interconnected units (e.g., through a communications network). The components of the system 680 can also include remote devices and any of a wide variety of computer readable media.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

We claim:

1. A memory system, comprising:
   a first high voltage (HV) circuit;
   a second HV circuit;
   a protection circuit electrically connected to the first HV circuit and the second HV circuit, the protection circuit including:
   a first trigger circuit electrically connected to the first HV circuit;
   a first silicon-controlled rectifier (SCR) connected to the first trigger circuit and having—
   a first grounding transistor electrically connected between the first HV circuit and ground and further electrically connected to the first trigger circuit, wherein the first grounding transistor configured to dynamically control an electrical connection between the first HV circuit and the ground according to the first trigger circuit, and
a first connecting transistor electrically connected between the first trigger circuit and the second HV circuit and further electrically connected to the first grounding transistor in anti-parallel, wherein the first connecting transistor is configured to dynamically control an electrical connection between the first and second HV circuits;
a second trigger circuit electrically connected to the first HV circuit;
a second SCR (1) electrically connected to the second trigger circuit and (2) electrically connected to the first SCR in anti-parallel, the second SCR having—
a second grounding transistor electrically connected between the second HV circuit and the ground and further electrically connected to the second trigger circuit, wherein the second grounding transistor configured to dynamically control an electrical connection between the second HV circuit and the ground according to the second trigger circuit, and
a second connecting transistor electrically connected between the second trigger circuit and the first HV circuit and further electrically connected to the second grounding transistor in anti-parallel, wherein the second connecting transistor is configured to dynamically control an electrical connection between the first and second HV circuits.

2. A memory system, comprising:
a first high voltage (HV) circuit;
a second HV circuit;
a protection circuit electrically connected to the first HV circuit and the second HV circuit, the protection circuit including:
  a first trigger circuit electrically connected to the first HV circuit;
  a first silicon-controlled rectifier (SCR) connected to the first trigger circuit and having—
    a first grounding transistor electrically connected between the first HV circuit and ground and further electrically connected to the first trigger circuit, wherein the first grounding transistor configured to dynamically control an electrical connection between the first HV circuit and the ground according to the first trigger circuit, and
    a first connecting transistor electrically connected between the first trigger circuit and the second HV circuit and further electrically connected to the first grounding transistor in anti-parallel, wherein the first connecting transistor is configured to dynamically control an electrical connection between the first and second HV circuits;
  a second trigger circuit electrically connected to the first HV circuit;
  a second SCR (1) electrically connected to the second trigger circuit and (2) electrically connected to the first SCR in anti-parallel, the second SCR having—
    a second grounding transistor electrically connected between the second HV circuit and the ground and further electrically connected to the second trigger circuit, wherein the second grounding transistor configured to dynamically control an electrical connection between the second HV circuit and the ground according to the second trigger circuit, and
    a second connecting transistor electrically connected between the second trigger circuit and the first HV circuit and further electrically connected to the second grounding transistor in anti-parallel, wherein the second connecting transistor is configured to dynamically control an electrical connection between the first and second HV circuits;
wherein the first and second trigger circuits each includes:
at least one resistor coupled to at least one capacitor electrically connected between a corresponding one of the first and second HV circuits and the ground, wherein the at least one resistor and the at least one capacitor are tuned to detect a threshold change in a voltage level of the corresponding HV circuit; and
a triggering transistor coupled to the at least one resistor and the at least one capacitor, the triggering transistor configured to change operating states based on the threshold change.

3. The memory system of claim 2, wherein:
the first and second grounding transistors are each configured to electrically connect the corresponding HV circuit to a grounding path based on an operating state of the corresponding triggering transistor; and
the first and second connecting transistors are each configured to electrically connect the first and second HV circuits based on an operating state of the corresponding grounding transistor.

4. The memory system of claim 2, wherein:
the first and second grounding transistors are configured to be inactive and isolate the corresponding HV circuit from a grounding path when the corresponding triggering transistor is inactive; and
the first and second connecting transistors are each configured to electrically isolate the first and second HV circuits from each other based on inactive state of the corresponding grounding transistor.

5. A memory system, comprising:
a first high voltage (HV) circuit;
a second HV circuit;
a protection circuit electrically connected to the first HV circuit and the second HV circuit, the protection circuit including:
  a first trigger circuit electrically connected to the first HV circuit;
  a first silicon-controlled rectifier (SCR) connected to the first trigger circuit and having—
    a first grounding transistor electrically connected between the first HV circuit and ground and further electrically connected to the first trigger circuit, wherein the first grounding transistor configured to dynamically control an electrical connection between the first HV circuit and the ground according to the first trigger circuit, and
    a first connecting transistor electrically connected between the first trigger circuit and the second HV circuit and further electrically connected to the first grounding transistor in anti-parallel, wherein the first connecting transistor is configured to dynamically control an electrical connection between the first and second HV circuits;
  a second trigger circuit electrically connected to the first HV circuit;
  a second SCR (1) electrically connected to the second trigger circuit and (2) electrically connected to the first SCR in anti-parallel, the second SCR having—
    a second grounding transistor electrically connected between the second HV circuit and the ground and further electrically connected to the second trigger circuit, wherein the second grounding transistor configured to dynamically control an electrical connection between the second HV circuit and the ground according to the second trigger circuit, and a second connecting transistor electrically connected between the second trigger circuit and the first HV circuit and further electrically connected to the second grounding transistor in anti-parallel, wherein the second connecting transistor is configured to dynamically control an electrical connection between the first and second HV circuits;

wherein the first and second trigger circuits each have:

a trigger transistor having a control portion and configured to deactivate upon detecting the corresponding triggering condition, wherein the deactivation triggers the connection between the first and second HV circuits;

at least one capacitor operatively coupling the control portion to one of the first and second HV circuits; and at least one resistor operably coupling the control portion to ground.

\* \* \* \* \*